(12) United States Patent
Ahmed et al.

(10) Patent No.: US 11,005,457 B2
(45) Date of Patent: May 11, 2021

(54) PTAT RING OSCILLATOR CIRCUIT

(71) Applicant: Apple Inc., Cupertino, CA (US)

(72) Inventors: Ramy A. Ahmed, Cupertino, CA (US); Amr A. Hafez, Santa Clara, CA (US); Jafar Savoj, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/006,750

(22) Filed: Jun. 12, 2018

(65) Prior Publication Data

US 2019/0379363 A1 Dec. 12, 2019

(51) Int. Cl.
*H03K 3/03* (2006.01)
*G01K 7/20* (2006.01)
*G01K 7/00* (2006.01)
*H03K 21/08* (2006.01)

(52) U.S. Cl.
CPC ............ *H03K 3/0315* (2013.01); *G01K 7/00* (2013.01); *G01K 7/203* (2013.01); *H03K 21/08* (2013.01)

(58) Field of Classification Search
CPC .. G01K 7/00; G01K 7/01; G01K 7/16; G01K 7/203; G01K 7/245; H03K 3/0315; H03K 3/0322
USPC ........................................................... 331/57
See application file for complete search history.

(56) References Cited

U.S. PATENT DOCUMENTS

| | | | | |
|---|---|---|---|---|
| 5,440,277 | A * | 8/1995 | Ewen ...................... | G05F 3/205 327/538 |
| 6,809,603 | B1 * | 10/2004 | Ho ...................... | H03K 3/0315 331/175 |
| 8,248,171 | B1 | 8/2012 | Bugbee et al. | |
| 9,528,883 | B2 | 12/2016 | Ramaraju et al. | |
| 2003/0214361 | A1 * | 11/2003 | Nishikido ............ | H03K 3/0231 331/57 |
| 2004/0108907 | A1 * | 6/2004 | Lim ........................ | G01K 7/01 331/66 |
| 2005/0206466 | A1 * | 9/2005 | Sohn ...................... | G11C 7/222 331/185 |
| 2007/0160113 | A1 * | 7/2007 | Kim ........................ | G01K 7/01 374/178 |
| 2010/0090014 | A1 * | 4/2010 | Okuda ............... | G06K 19/0701 235/492 |

(Continued)

FOREIGN PATENT DOCUMENTS

| | | |
|---|---|---|
| CN | 102386848 | 7/2014 |
| CN | 105071801 | 11/2017 |
| TW | I387736 | 3/2013 |

*Primary Examiner* — Levi Gannon
(74) *Attorney, Agent, or Firm* — Kowert, Hood, Munyon, Rankin & Goetzel, P.C.; Erik A. Heter

(57) ABSTRACT

A circuit that produces an output signal having a frequency that is proportional to absolute temperature (PTAT) is disclosed. In one embodiment, the circuit includes a ring oscillator and a bias current circuit coupled thereto. The ring oscillator and the bias current circuit are implemented in close proximity to one another. During operation, the bias current circuit generates a bias current that is provided to the ring oscillator. The amount of bias current generated is dependent upon the temperature of the circuit. In turn, the frequency of an output signal provided by the ring oscillator is dependent on the amount of bias current received from the bias current circuit. Accordingly, the frequency of the ring oscillator output signal is dependent on the temperature of the circuit.

18 Claims, 7 Drawing Sheets

(56) References Cited

U.S. PATENT DOCUMENTS

| | | | |
|---|---|---|---|
| 2010/0295580 A1* | 11/2010 | Liu | H03M 1/60 327/77 |
| 2015/0116042 A1* | 4/2015 | Kim | H03K 3/011 331/57 |
| 2017/0089975 A1* | 3/2017 | Savoj | G01R 31/2874 |

* cited by examiner

PTAT RING OSCILLATOR CIRCUIT

BACKGROUND

Technical Field

This disclosure is directed to electronic circuits, and more particularly, to circuits that produce an output signal having a frequency that is proportional to a temperature.

Description of the Related Art

Ring oscillators are commonly used in various types of electronic circuits. For example, sensors implemented on integrated circuits (ICs) may use ring oscillators to sense parameters such as voltage and/or temperature. As features sizes have decreased, the number of transistors on ICs has correspondingly increased. The increased number of transistors per unit area has resulted in a corresponding increase in thermal output of ICs. Furthermore, the increased number of transistors per unit area has also corresponded to a decrease in the supply voltages provided to various functional circuitry on an IC. This has in turn led to significant challenges in balancing performance, power consumption, and thermal output of ICs. To this end, many ICs implement subsystems that monitor various metrics of the IC (e.g., temperature, voltage, voltage droops) and adjust the performance based on received measurements. For example, a control subsystem may reduce a clock frequency, supply voltage, or both, responsive to a temperature reading that exceeds a predefined threshold. This may help maintain operation of the IC within specified thermal limits. Such control systems may also boost the performance of certain functional circuits when measured metrics are well within limits.

IC subsystems used to control performance based on system metrics typically include one or more sensors and at least one control system. At least some of these sensors may be based on ring oscillators. The frequency of a periodic signal generated by such ring oscillators may be used to determine a current value of a corresponding parameter.

SUMMARY

A circuit that produces an output signal having a frequency that is proportional to absolute temperature (PTAT) is disclosed. In one embodiment, the circuit includes a ring oscillator and a bias current circuit coupled thereto. The ring oscillator and the bias current circuit are implemented in close proximity to one another. During operation, the bias current circuit generates a bias current that is provided to the ring oscillator. The amount of bias current generated is dependent upon the temperature of the circuit. In turn, the frequency of an output signal provided by the ring oscillator is dependent on the amount of bias current received from the bias current circuit. Accordingly, the frequency of the ring oscillator output signal is dependent on the temperature of the circuit.

In one embodiment, the bias circuit includes first and second current mirrors coupled to one another. The second current mirror is coupled to provide the bias current to the ring oscillator. The first current mirror includes first and second transistors having first and second gate-source voltages, respectively. The first and second transistors may be biased in a subthreshold region of operation. Furthermore, the bias current is dependent on a difference between the first and second gate-source voltages, as well as the resistance of a bias resistor implemented in the circuit.

BRIEF DESCRIPTION OF THE DRAWINGS

The following detailed description makes reference to the accompanying drawings, which are now briefly described.

Figure 1:
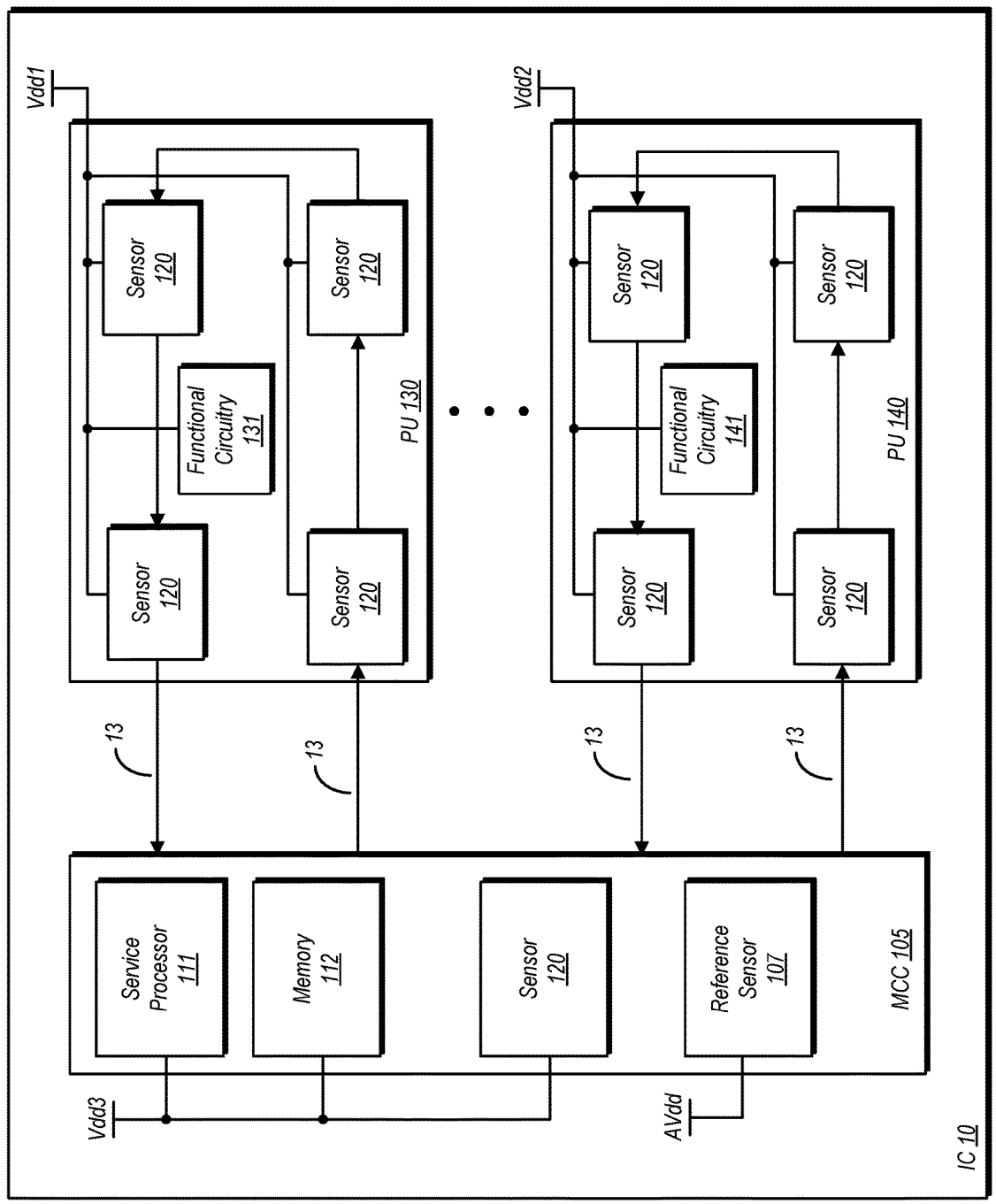
FIG. 1 is a block diagram of one embodiment of an IC.

It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element.

Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an IC 10. In the embodiment shown, IC 10 includes a number of functional circuit blocks, e.g., processing unit (PU) 130 and PU 140, which include functional circuitry 131 and functional circuitry 141, respectively. PU 130 in the embodiment shown (and thus the circuitry therein, including sensors 120) is coupled to receive a supply voltage Vdd1, while PU 140 (along with its functional circuitry 141 and sensors 120) is coupled to receive a supply voltage Vdd2. IC 10 also includes a number of sensors 120, with each of the functional circuit blocks including instances of the sensors. Each of the sensors includes at least one ring oscillator and a bias circuit coupled thereto. The bias circuit may provide a bias current to the ring oscillator, the bias current being proportional to a temperature of the bias circuit. The ring oscillator may produce a corresponding output signal having a frequency that is proportional to the bias current. Embodiments of a sensor and a bias circuit are discussed in further detail below.

As shown in FIG. 1, IC 10 includes metrology control center (MCC) 105 coupled to each of functional circuit blocks PU 130 and PU 140. More particularly, individual instances of a bus 13 are coupled to particular sensors 120 in each of the functional circuit blocks. As will be discussed below, each sensor 120 may include a register coupled to the bus 13 to facilitate the transfer of information from that sensor 120 to MCC 105.

MCC 105 in the embodiment shown includes a service processor 111 and a memory 112, along with another instance of sensor 120, with each of these blocks coupled to receive a third supply voltage, Vdd3. MCC 105 also includes a reference sensor 107 in the illustrated embodiment coupled to receive a supply voltage AVdd as illustrated in FIG. 1.

Figure 2:
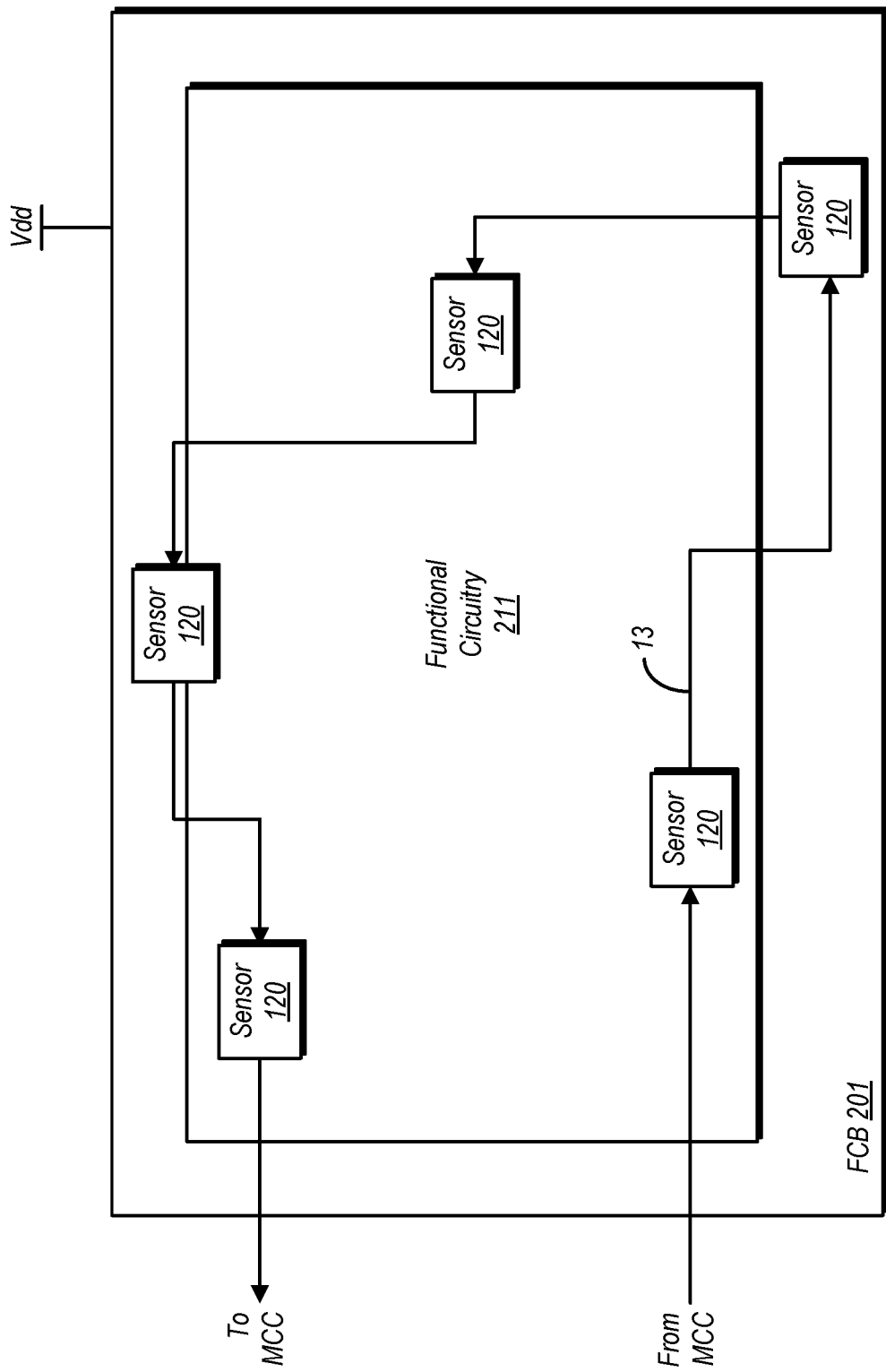
FIG. 2 is a block diagram of one embodiment of a functional circuit block having a number of sensors.

FIG. 2 is a block diagram of one embodiment of a functional circuit block 201 having a number of sensors 120. In the embodiment shown, functional circuit block (FCB) 201 includes functional circuitry 211, which may implement any suitable type of functional circuitry, including that discussed above with reference to FIG. 1. FCB 201 also includes a number of sensors 120, which are connected in a chain by bus 13. A first sensor 120 in the embodiment shown is coupled to receive information, via bus 13, from MCC 105, while a last sensor 120 may send information, via bus 13, to MCC 105. Each sensor 120 may include a register that is coupled to receive a count value from a counter implemented therein, and may convey the count value, via bus 13, to MCC 105. The count value may be indicative of a frequency of at least one ring oscillator implemented within the same sensor in which the register is implemented.

Figure 3:
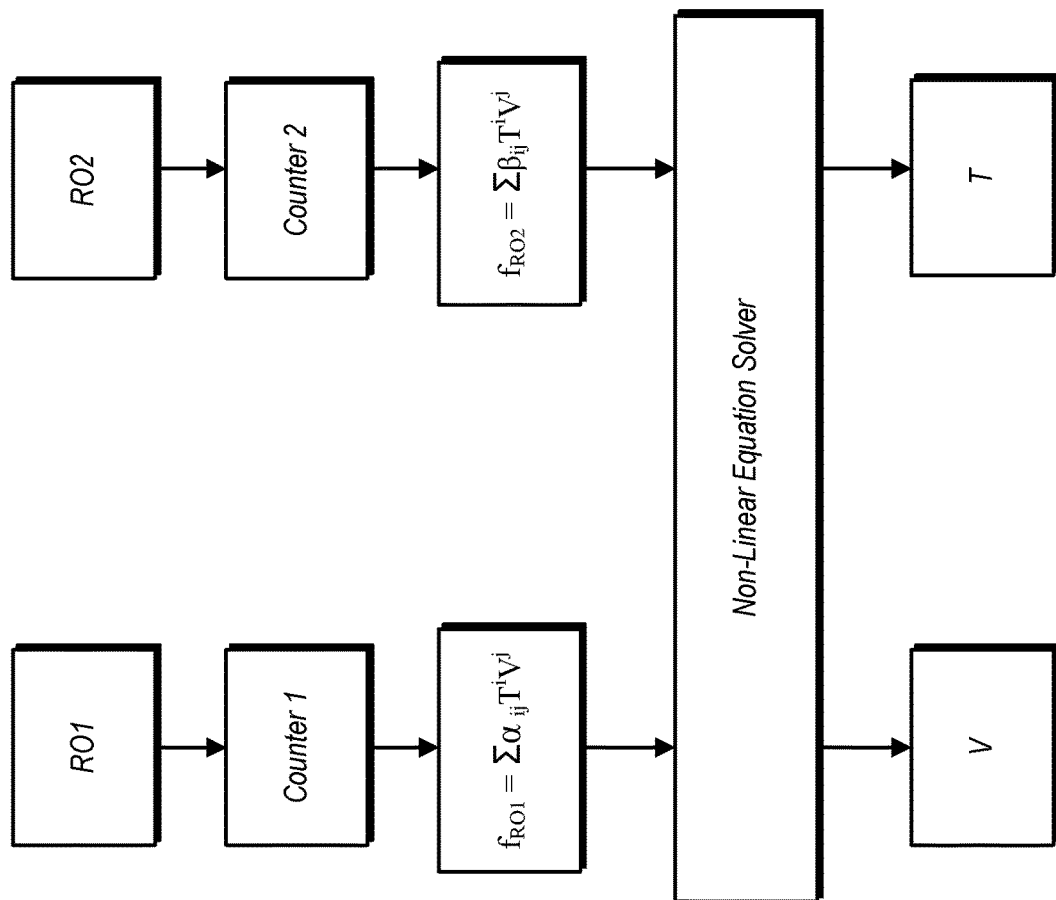
FIG. 3 is a block diagram illustrating an operational concept for an embodiment of a sensor employing two ring oscillators.

FIG. 3 is a block diagram illustrating an operational concept for an embodiment of a sensor employing two ring oscillators. More particularly, FIG. 3 illustrates an operational concept for an embodiment of sensor 120 as disclosed herein. As shown in the drawing, there are two ring oscillators, RO1 and RO2, which are coupled to Counter 1 and Counter 2. Each ring oscillator may cause its respectively coupled counter to increment for a time, producing a count value. This count value corresponds to a frequency of the output signal of the ring oscillators.

The frequency of the ring oscillators may be equivalent to the equations shown in the drawing. Thus, the frequency of RO1 may be characterized as $f_{RO1} = \Sigma \alpha_{ij} T^i V^j$ (Equation 1), while the frequency of RO2 may be characterized as $f_{RO2} = \Sigma \beta_{ij} T^i V^j$ (Equation 2). As shown in both Equations 1 and 2, the frequency produced by each of the ring oscillators is based on different characteristics with respect to one another, as indicated by the coefficients in the respective equations (a in Equation 1, β in Equation 2). For both ring oscillators, the respective frequencies are functions of voltage and temperature values. These voltage and temperature values may be determined by a non-linear equation solver, which outputs values indicative of a voltage V and a temperature T.

Figure 4:
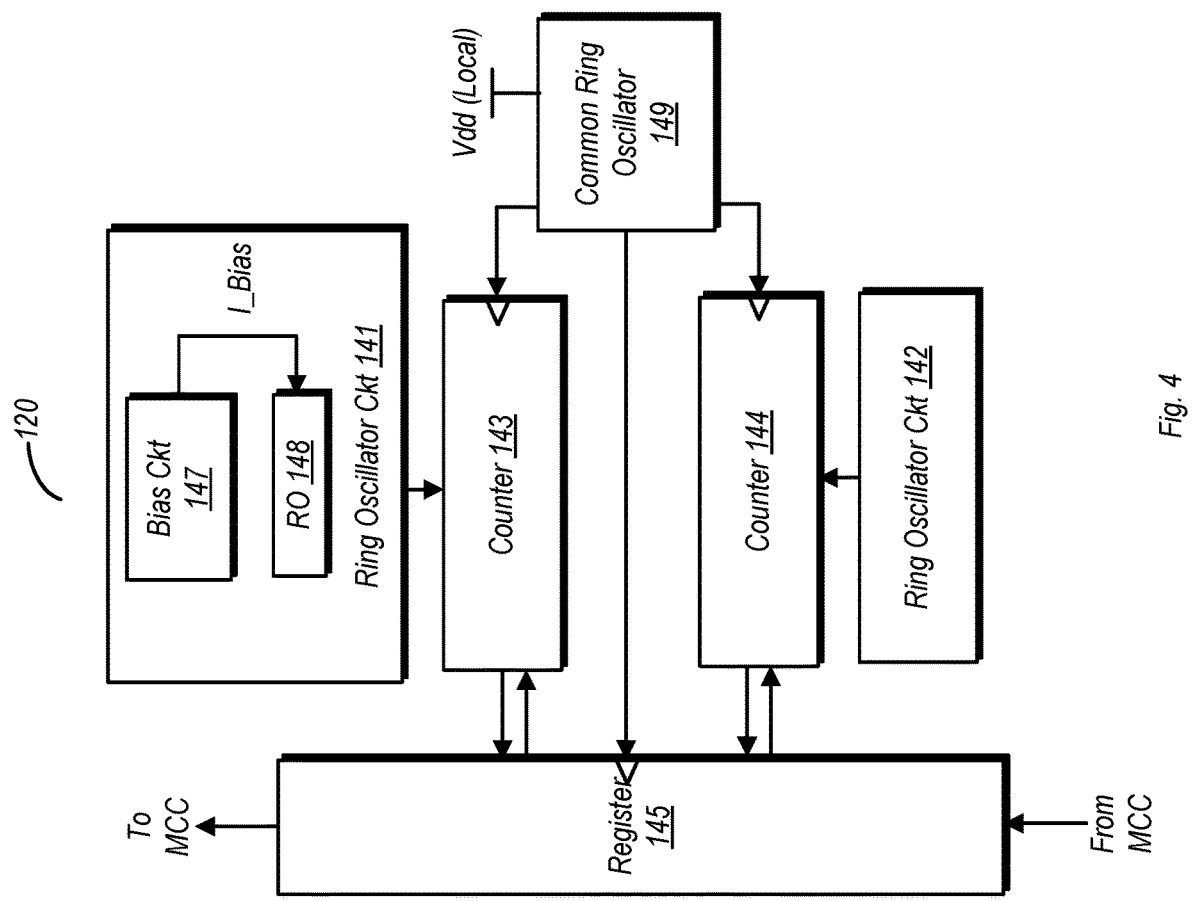
FIG. 4 is a block diagram of one embodiment of a sensor having two ring oscillators.

FIG. 4 is a block diagram of one embodiment of a sensor having two ring oscillators. In the embodiment shown, sensor 120 includes a first ring oscillator circuit 141 and a second ring oscillator circuit 142, each of which may include a ring oscillator. Ring oscillator circuit 141 in the embodiment shown includes a ring oscillator 148 and bias circuit 147. Ring oscillator circuit 141 and ring oscillator circuit 142 are coupled to counters 143 and 144, respectively. Each of the counters 143 and 144 are coupled to register 145, which may receive information from MCC 105 (as shown in FIG. 1) or convey information to MCC 105, via bus 13. Each of the counters is also coupled to common ring oscillator 149, which is coupled to receive a local supply voltage, Vdd (Local). Both of counters 143 and 144 are clocked by the output signal from common ring oscillator 149.

For a given one of ring oscillator circuits 141 and 142, the correspondingly coupled counter may generate a count value corresponding to the frequency of the output signal provided by that ring oscillator. Register 145 in the embodiment shown may receive the respective count values from counters 143 and 144, and convey these count values, via the bus 13, to MCC 105.

In the embodiment shown, the bias circuit 147 is coupled to provide the bias current to the inverters of ring oscillator 148. Bias circuit 147 is configured to provide a bias current to ring oscillator 148 such that the bias current is proportional to the temperature of the circuit. Accordingly, ring oscillator 148 may produce an output signal having a frequency that is proportional to the bias current, and thus the temperature. An embodiment of bias circuit 147 is now discussed in further detail with reference to FIG. 5.

Figure 5:
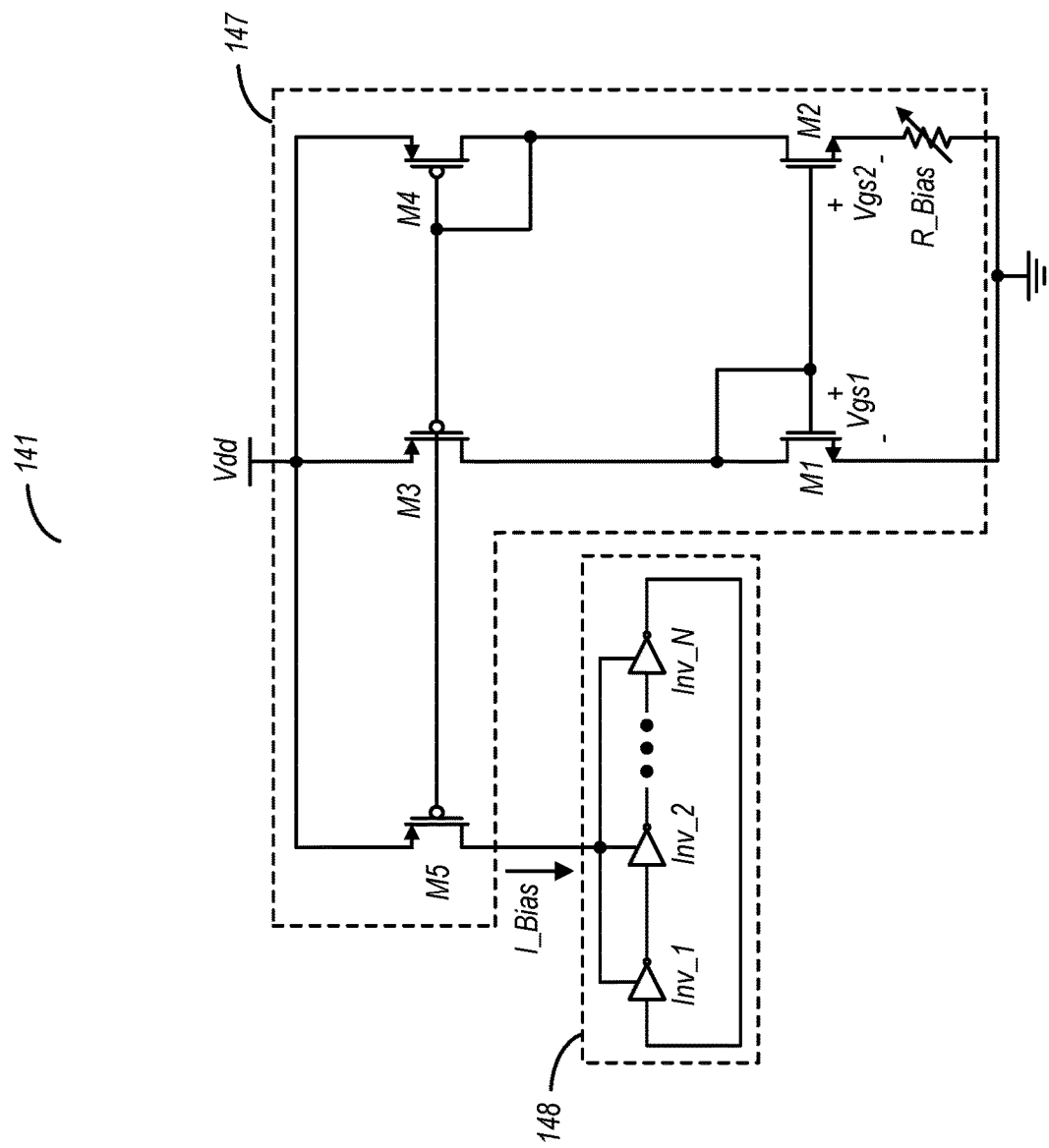
FIG. 5 is a schematic diagram of one embodiment of a ring oscillator circuit including a ring oscillator and a bias circuit.

FIG. 5 is a schematic diagram of one embodiment of a ring oscillator circuit including a ring oscillator and a bias circuit. In the embodiment shown, ring oscillator circuit 141 includes bias circuit 147 and ring oscillator 148. Bias circuit 147 includes first and second current mirrors, wherein the first current mirror is configured to set the bias current that is eventually produced as I_Bias. The second current mirror is coupled to the first current mirror, and is coupled to provide the bias current to the ring oscillator. The first current mirror includes transistors M1 and M2, with M1 being a diode-coupled device. The second current mirror includes transistors M3, M4, and M5, with M4 being a diode-coupled device. The bias current, I_bias, is delivered through transistor M5, and is provided directly to ring oscillator 148 via its voltage supply node, which is distributed to all of the inverters of the ring oscillator in this particular embodiment. M1 in the embodiment shown includes a drain terminal coupled to the drain terminal of M3, while the drain terminal of M2 is coupled to the drain terminal of M4. M1 and M2 in the embodiment shown are NMOS devices, while M3, M4, and M5 are PMOS devices.

In the embodiment shown, bias circuit includes a resistor, R_Bias, coupled between M2 and a reference (ground) node. This resistors, as shown, may be a variable resistor, and may factor into the amount of bias current provided. The bias current in the embodiment shown is based on the different between the gate-source voltages (Vgs1 for M1, and Vgs2 for M2) and a resistance of R_bias. During operation of bias circuit 141, the gate-source voltages of M1 and M2 may be proportional to the temperature of the circuit. This may be accomplished by biasing these devices to operate in the subthreshold operating region.

Ring oscillator 148 in the embodiment shown includes a number of inverters, a total of N in all wherein N is an odd integer number. An output of the Nth inverter is coupled to an input of the first inverter. As shown herein, the bias current is provided directly via a voltage supply node of the inverters. It is noted that the disclosure is not limited to ring oscillators of this type. Furthermore, in light of the above, as expressed in Equations 1 and 2, the ring oscillators in a sensor 120 may have different characteristics with respect to one another. Accordingly, the circuitry used to implement such ring oscillators may also be different with respect to one another.

Since the bias current is dependent on the temperature of the circuit, as noted above, the frequency of an output signal produced by ring oscillator 148 will have a temperature dependency.

Figure 6:
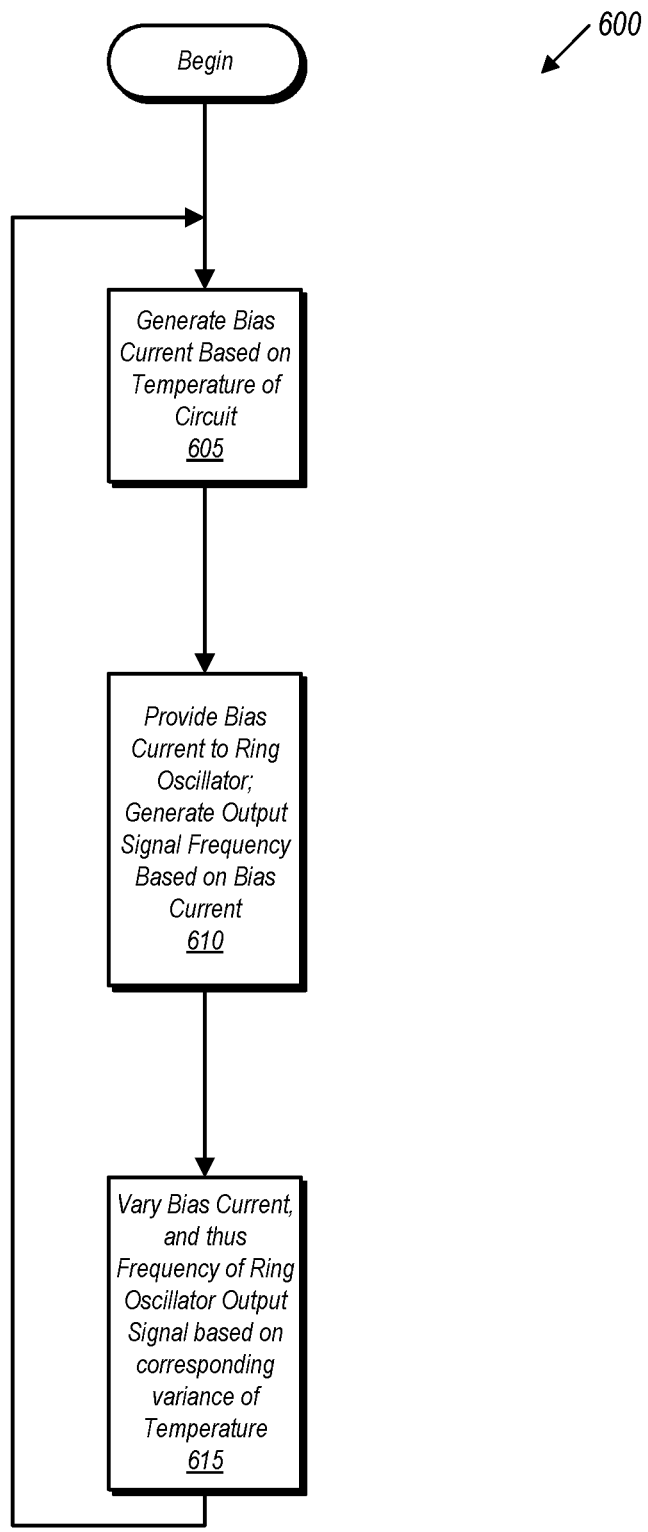
FIG. 6 is a flow diagram illustrating one embodiment of a method for operating a ring oscillator circuit.

FIG. 6 is a flow diagram illustrating one embodiment of a method for operating a ring oscillator circuit. Method 600 may be carried out using various embodiments of the circuitry discussed above, among others.

Method 600 includes generating a bias current using a bias current circuit, wherein an amount of bias current generated by the bias current is dependent on a temperature of the bias current circuit (block 605). The method further includes providing the bias current to a ring oscillator circuit and generating a periodic output signal, using the ring oscillator circuit, based on the amount of bias current provided by the bias current circuit (block 610). The method further includes varying the bias current, and thus the frequency of the ring oscillator output signal based on the corresponding variance in temperature (block 615).

In various embodiments, the method includes generating the bias current based on a difference between first and second gate-source voltages of first and second transistors, respectively, the first and second transistors being part of a first current mirror in the bias current circuit, and wherein the difference between the first and second gate-source voltages has a linear relationship to a temperature of the bias current circuit. A difference between gate-source voltages of the first and second transistors is proportional to a temperature of the circuit. The bias circuit includes first and second current mirrors, wherein the first current mirror is configured to set the bias current, wherein the second current mirror is coupled to the first current mirror, and wherein the second current mirror is coupled to provide the bias current to the ring oscillator. The first current mirror includes first and second transistors and a resistor coupled between the second transistor and a reference node, wherein the first transistor is diode-coupled. Various embodiments of the method also includes biasing the first and second transistors in a subthreshold operating region.

Figure 7:
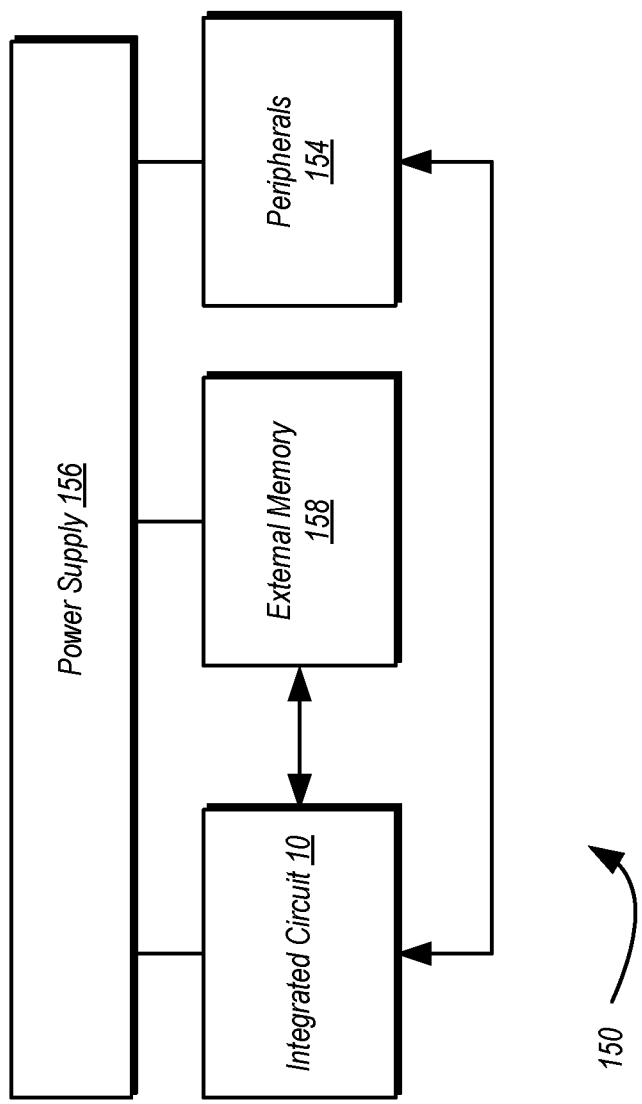
FIG. 7 is a block diagram of one embodiment of an example system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
    a ring oscillator having a plurality of inverting circuits; and
    a bias circuit coupled to the ring oscillator, wherein the bias circuit is configured to provide a bias current to cause the ring oscillator to produce an output signal having a frequency that is proportional to a temperature of the bias circuit, wherein the bias circuit includes:
        a first current mirror comprising first and second transistors having respective gate terminals coupled to one another to form the first current mirror;
        a bias resistor coupled between a source terminal of the second transistor and a ground node;
        a second current mirror comprising third and fourth transistors, wherein respective gate terminals of the third and fourth transistors are coupled to one another, and wherein drain terminals of the first and second transistors are coupled to drain terminals of the third and fourth transistors, respectively; and
        a fifth transistor having a gate terminal directly coupled to respective gate terminals of the third and fourth transistors, wherein a drain terminal of the fifth transistor is coupled to a single voltage node of the ring oscillator to provide the bias current to the ring oscillator.

2. The circuit as recited in claim 1, wherein the first current mirror is configured to set the bias current.

3. The circuit as recited in claim 1, wherein the bias current is based on a difference between gate-source voltages of the first and second transistors and a resistance of the bias resistor.

4. The circuit as recited in claim 3, wherein the difference between the gate-source voltages of the first and second transistors is proportional to a temperature of the circuit.

5. The circuit as recited in claim 1, wherein the first and second transistors are biased in a subthreshold operating region.

6. The circuit as recited in claim 1, wherein the fourth transistor is diode-coupled.

7. The circuit as recited in claim 1, wherein the resistor is a variable resistor.

8. A method comprising:
    generating a bias current using a bias current circuit, wherein an amount of bias current generated by the bias current is dependent on a temperature of the bias current circuit, wherein generating the bias current is based on a difference between first and second gate-source voltages of first and second transistors, respectively, the first and second transistors being part of a first current mirror in the bias current circuit, and wherein the difference between the first and second gate-source voltages has a linear relationship to a temperature of the bias current circuit;
    providing the bias current to a ring oscillator via a single node to each of a plurality of inverting circuits of the ring oscillator circuit, wherein providing the bias current comprises using a second current mirror having third, fourth, and fifth transistors to provide the bias current directly via a drain terminal of the fifth transistor, wherein the third and fourth transistors are coupled to the first and second transistors, respectively, and wherein respective gate terminals of the third, fourth, and fifth transistors are directly coupled to one another; and
    generating a periodic output signal, using the ring oscillator circuit, based on the amount of bias current provided by the bias current circuit.

9. The method as recited in claim 8, further comprising biasing the first and second transistors in a subthreshold operating region.

10. The method of claim 8, further comprising generating the bias current based at least in part on a difference between gate-source voltages of the first and second transistors.

11. The method of claim 10, further comprising generating the bias current based at least in part on a resistance of a resistor coupled between a source terminal of the second transistor and a ground node.

12. The method of claim 11, wherein the resistor is a variable resistor.

13. The method of claim 8, further comprising a counter generating a count value based on a frequency of the output signal from the ring oscillator.

14. An integrated circuit comprising:
    a plurality of functional circuit blocks each including functional circuitry; and
    a plurality of sensors, wherein each of the plurality of functional circuit blocks includes at least one of the plurality of sensors implemented therein, and wherein each of the plurality of sensors includes:
        a ring oscillator including a plurality of inverting circuits; and
        a bias circuit coupled to the ring oscillator, wherein the bias circuit is configured to provide a bias current to cause the ring oscillator to produce an output signal at a frequency that is proportional to a temperature of the bias circuit, wherein the bias circuit includes:
            a first current mirror comprising first and second transistors having respective gate terminals coupled to one another to form a first current mirror;
            a bias resistor coupled between a source terminal of the second transistor and a ground node;
            a second current mirror coupled to the first current mirror and comprising third and fourth transistors, wherein respective gate terminals of the third and fourth transistors are coupled to one another; and
        a fifth transistor having a gate terminal directly coupled to respective gate terminals of the third and fourth transistors, wherein a drain terminal of the fifth transistor is coupled to a single voltage node of the ring oscillator to provide the bias current to the ring oscillator.

15. The integrated circuit as recited in claim 14, wherein a difference between gate-source voltages of the first and second transistors is proportional to a temperature of the integrated circuit.

16. The integrated circuit as recited in claim 14, wherein the first and second transistors are biased in a subthreshold operating region.

17. The integrated circuit as recited in claim 14, further comprising at least one counter coupled to receive the output signal from the at least one ring oscillator, wherein the at least one counter is configured to generate a count value corresponding to the frequency of the output signal.

18. The integrated circuit as recited in claim 17, further comprising a register coupled to receive the count value from the at least one counter, wherein the register is coupled to a bus and is configured to convey the count value, via the bus, to a control circuit.

* * * * *